US 6,598,805 B2

(12) United States Patent
Sakai et al.

(10) Patent No.: US 6,598,805 B2
(45) Date of Patent: Jul. 29, 2003

(54) SUBSTRATE CLEANING APPARATUS

(75) Inventors: Takamasa Sakai, Kyoto (JP); Sadao Hirae, Kyoto (JP)

(73) Assignee: Dainippon Screen Mfg. Co., LTD (JP)

( * ) Notice: Subject to any disclaimer, the term of this patent is extended or adjusted under 35 U.S.C. 154(b) by 0 days.

(21) Appl. No.: 10/147,243

(22) Filed: May 15, 2002

(65) Prior Publication Data

US 2002/0179732 A1 Dec. 5, 2002

(30) Foreign Application Priority Data

May 30, 2001 (JP) ....................................... 2001-161898
May 30, 2001 (JP) ....................................... 2001-161899

(51) Int. Cl.[7] .............................. B05B 1/24; B05B 7/16; B05C 1/00; B08B 9/00; B08B 3/00
(52) U.S. Cl. .................... 239/128; 239/136; 239/137; 239/139; 239/419; 239/132; 134/22.15; 134/30; 134/36; 134/902
(58) Field of Search ................... 239/124, 128, 239/135, 136, 137, 138, 139, 419, 589, 132, 132.1, 132.3, 132.5, 133, 423, 424; 134/902, 84, 102.1, 102.2, 105, 106, 107, 22.15, 22.19, 24, 30, 35, 36, 37; 261/DIG. 65; 438/905

(56) References Cited

U.S. PATENT DOCUMENTS

| 4,079,522 A | * | 3/1978 | Ham .............................. 34/1 |
| 4,186,032 A | * | 1/1980 | Ham ............................ 134/31 |
| 4,977,688 A | * | 12/1990 | Robertson, Jr. et al. ........ 34/92 |
| 5,120,370 A | * | 6/1992 | Mori et al. ............... 134/22.15 |
| 5,589,005 A | * | 12/1996 | Ohmi ........................... 134/30 |
| 5,873,380 A | * | 2/1999 | Kanno ....................... 134/102.1 |
| 5,931,654 A | * | 8/1999 | Chamberland ................... 431/8 |
| 6,146,469 A | * | 11/2000 | Toshima ........................ 134/37 |
| 6,202,318 B1 | * | 3/2001 | Guldi et al. .................... 34/79 |
| 6,431,185 B1 | * | 8/2002 | Tomita et al. ............... 134/1.3 |

FOREIGN PATENT DOCUMENTS

| EP | 0422653 A2 | * | 10/1990 | ............. F22B/1/28 |
| WO | WO 02/09894 A2 | * | 2/2002 | |

* cited by examiner

Primary Examiner—Kevin Shaver
Assistant Examiner—Anuradha Ramana
(74) Attorney, Agent, or Firm—Ostrolenk, Faber, Gerb & Soffen, LLP

(57) ABSTRACT

A gas mixture of dry steam and nitrogen gas serving as carrier gas is blown into a hot water mist injection port for rendering the nitrogen gas serve as a medium absorbing latent heat of condensation, thereby smoothly progressing condensation of water vapor and efficiently forming hot water mist. The water vapor is condensed in the hot water mist injection port formed by a cylindrical pipe for supplying latent heat of condensation to the nitrogen gas and dilating the same, thereby accelerating the flow of the hot water mist and spraying the hot water mist to a substrate from the hot water mist injection port at a high speed. Small droplets contained in the high-speed hot water mist have high kinetic energy and high thermal energy, for exhibiting a large colliding effect and a high activation effect with respect to small contaminants adhering to the substrate. A substrate cleaning apparatus capable of spraying hot water mist attaining a high cleaning effect to a substrate is provided.

11 Claims, 3 Drawing Sheets

SUBSTRATE CLEANING APPARATUS

BACKGROUND OF THE INVENTION

1. Field of the Invention

The present invention relates to a substrate cleaning apparatus cleaning a semiconductor substrate, a glass substrate for a liquid crystal display, a glass substrate for a photomask or a substrate for an optical disk (hereinafter simply referred to as "substrate") by spraying hot water mist thereto.

2. Description of the Background Art

A product such as a semiconductor or a liquid crystal display is manufactured by performing a series of processing such as cleaning, resist coating, exposure, development, etching, formation of an interlayer dielectric film, heat treatment and the like on a substrate. Among these, cleaning is processing of removing contaminants such as particles adhering to the substrate, which is increasingly regarded as important following recent progress of refinement and complication of patterns.

A representative substrate processing apparatus employed in general is the so-called spin scrubber rotating a substrate while bringing a brush into contact with the surface of the substrate or approaching the former to the latter thereby scrubbing out contaminants such as particles adhering to the surface of the substrate. In this technique of forcibly scrubbing out the contaminants through frictional force of the brush, however, the brush disadvantageously damages the surface of the substrate although a strong cleaning effect is attained.

Therefore, a non-contact substrate cleaning apparatus employing no brush has recently been watched with interest. For example, a system of supplying ultrasonic waves to a liquid coming into contact with the surface of a substrate or a system of spraying pure water mist at a high speed is being studied. The system spraying pure water mist collides small droplets substantially identical in size to the contaminants adhering to the surface of the substrate with the contaminants from random directions, to attain a high cleaning effect. Particularly when spraying hot water mist containing droplets having a temperature higher than the room temperature at a high speed, an activation effect can also be attained due to thermal energy of the droplets, and hence it is expected that a higher cleaning effect will be attained.

In general, however, it is difficult to form hot water mist containing small droplets having both high kinetic energy and high thermal energy. When high-temperature steam is merely injected toward a substrate, for example, the steam is not readily condensed and no hot water mist is formed.

SUMMARY OF THE INVENTION

The present invention is directed to a substrate cleaning apparatus cleaning a substrate by spraying thereon hot water mist.

A substrate cleaning apparatus according to the present invention, cleaning a substrate by spraying thereon hot water mist, comprises a steam guiding and feeding part for guiding and feeding steam obtained by heating pure water and a tubular discharge nozzle fixedly provided on the steam guiding and feeding part for forming hot water mist by guiding a gas mixture prepared by mixing steam and carrier gas with each other while condensing the steam and spraying the hot water mist onto the substrate.

The carrier gas functions as a medium absorbing latent heat of condensation for smoothly progressing condensation of water vapor and efficiently forming hot water mist. The formed hot water mist is accelerated due to dilation of the carrier gas increased in temperature by absorbing latent heat of condensation, and sprayed onto the substrate W as high-speed hot water mist attaining a high cleaning effect.

According to a preferred embodiment of the present invention, the substrate cleaning apparatus further comprises a gas discharge pipe discharging the carrier gas in the steam guiding/feeding part, and a gas discharge direction of the gas discharge pipe aligns with a fluid passage direction of the discharge nozzle.

The gas mixture of the steam and the carrier gas discharged from the gas discharge pipe efficiently flows into the discharge nozzle, so that high-temperature hot water mist can be readily formed.

According to another embodiment of the present invention, a substrate cleaning apparatus cleaning a substrate by spraying hot water mist thereto comprises a pure water supply part supplying pure water for forming dry steam, a steam generation part communicating with the pure water supply part for heating the pure water supplied from the pure water supply part and generating steam, a steam heating part communicatively connected with the steam generation part for heating the steam generated in the steam generation part and forming dry steam, and a discharge nozzle fixedly provided on the steam heating part for forming hot water mist by guiding the formed dry steam while condensing the dry steam and spraying the hot water mist to the substrate.

The steam heating part can completely vaporize part of the pure water not completely vaporizable in the steam generation part so that dry steam of high purity can be formed through a simple miniature structure. Consequently, hot water mist containing a small quantity of impurities and attaining a high cleaning effect can be sprayed to the substrate.

Accordingly, an object of the present invention is to provide a substrate cleaning apparatus capable of spraying hot water mist attaining a high cleaning effect to a substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described in detail with reference to the drawings.

Figure 1:
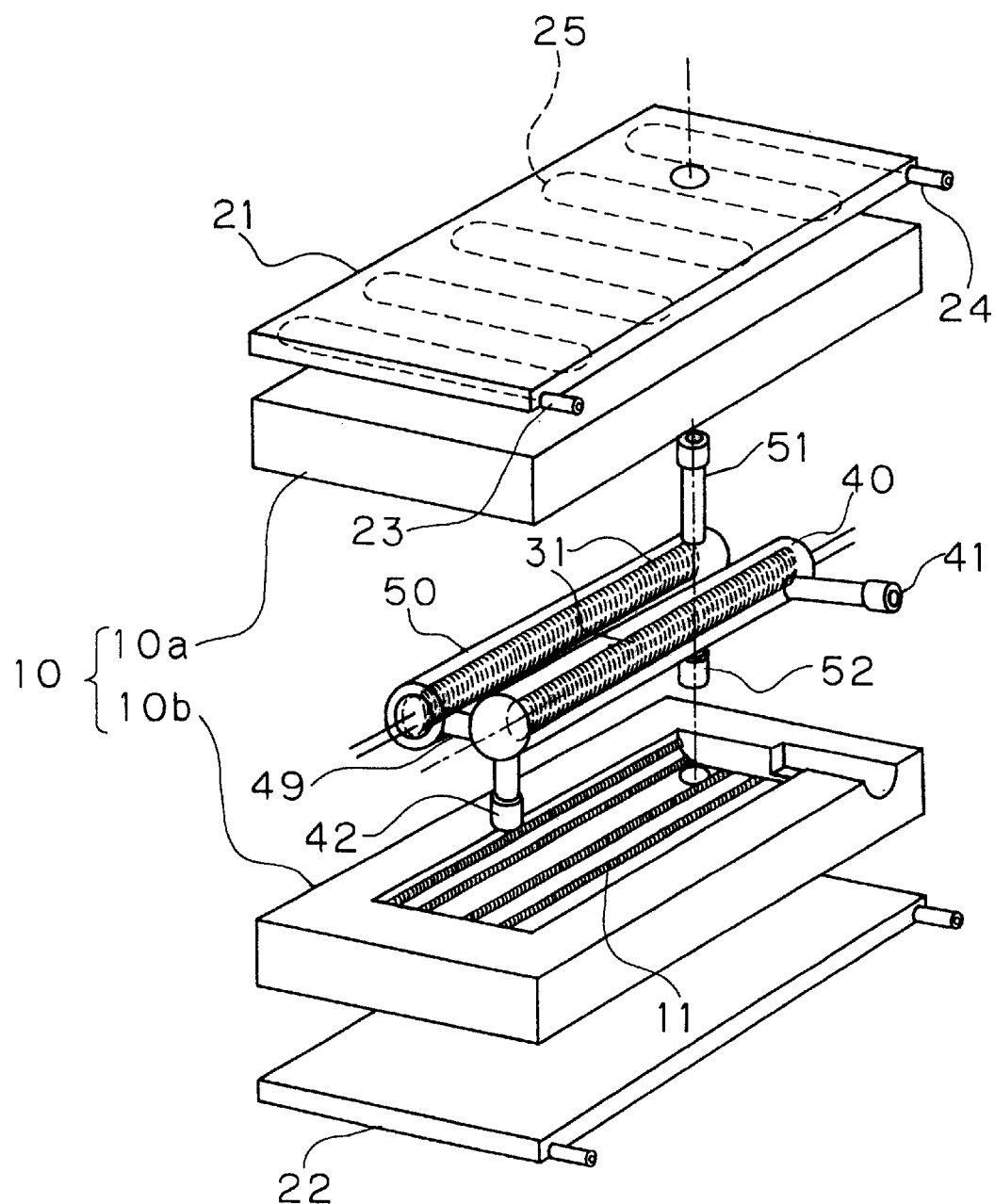
FIG. 1 is an exploded perspective view of a substrate cleaning apparatus according to an embodiment of the present invention.

FIG. 1 is an exploded perspective view of a substrate cleaning apparatus according to the embodiment of the present invention. This substrate cleaning apparatus, cleaning a substrate by spraying hot water mist thereto, comprises a ceramic fiber furnace 10, aluminum water cooling plates 21 and 22, a steam generation tube 40 and a steam heating tube 50.

The ceramic fiber furnace 10 is formed by a pair of upper and lower furnaces 10a and 10b. The upper and lower furnaces 10a and 10b are formed with concave portions along the shapes of the steam generation tube 40 and the steam heating tube 50, so that extratubal heaters 11 are embedded in the concave portions. The extratubal heaters 11 are in contact with the outer sides of the steam generation tube 40 and the steam heating tube 50. The ceramic fiber furnace 10 is formed with holes receiving various types of ports connected to the steam generation tube 40 and the steam heating tube 50.

The aluminum water cooling plate 21, which is a water cooling plate of aluminum absorbing waste heat discharged from the ceramic fiber furnace 10, is applied to the upper surface of the upper furnace 10a. The aluminum water cooling plate 21 stores a meandering cooling pipe 25. A cooling water inlet port 23 and a cooling water outlet port 24 are connected to both ends of the cooling pipe 25 respectively. The cooling water inlet port 23 is communicatively connected with a pure water supply source (not shown), which feeds pure water to the cooling water inlet port 23. The pure water fed to the cooling water inlet port 23 flows through the cooling pipe 25, and flows out from the cooling water outlet port 24.

The aluminum water cooling plate 21 feeds the pure water into the cooling pipe 25 thereby absorbing waste heat discharged from the ceramic fiber furnace 10. In other words, the pure water flowing through the cooling pipe 25 absorbs heat transmitted from the furnace walls of the ceramic fiber furnace 10 and discharges the same from the aluminum water cooling plate 21. According to this embodiment, the cooling water outlet port 24 is communicatively connected with a pure water spray 60 described later for supplying hot pure water increased in temperature by flowing through the cooling pipe 25 and absorbing the waste heat discharged from the ceramic fiber furnace 10 to the pure water spray 60, which in turn blows the hot pure water into the steam generation tube 40.

The aluminum water cooling plate 22, also formed by a water cooling plate of aluminum absorbing waste heat discharged from the ceramic fiber furnace 10, is applied to the lower surface of the lower furnace 10b. The aluminum water cooling plate 22 having the same structure as the aluminum water cooling plate 21 absorbs waste heat discharged from the ceramic fiber furnace 10 by the pure water flowing through the cooling pipe and supplies hot pure water increased in temperature to the pure water spray 60.

The steam generation tube 40 and the steam heating tube 50, the details of which are described later, are communicatively connected with each other through a communicating tube 49. A pure water inlet port 41 and an internal pressure release port 42 are connected to the steam generation tube 40, while a nitrogen gas inlet port 51 and a hot water mist injection port 52 are connected to the steam heating tube 50. Intratubal heaters 31 are provided in the steam generation tube 40 and the steam heating tube 50 respectively.

Figure 2:
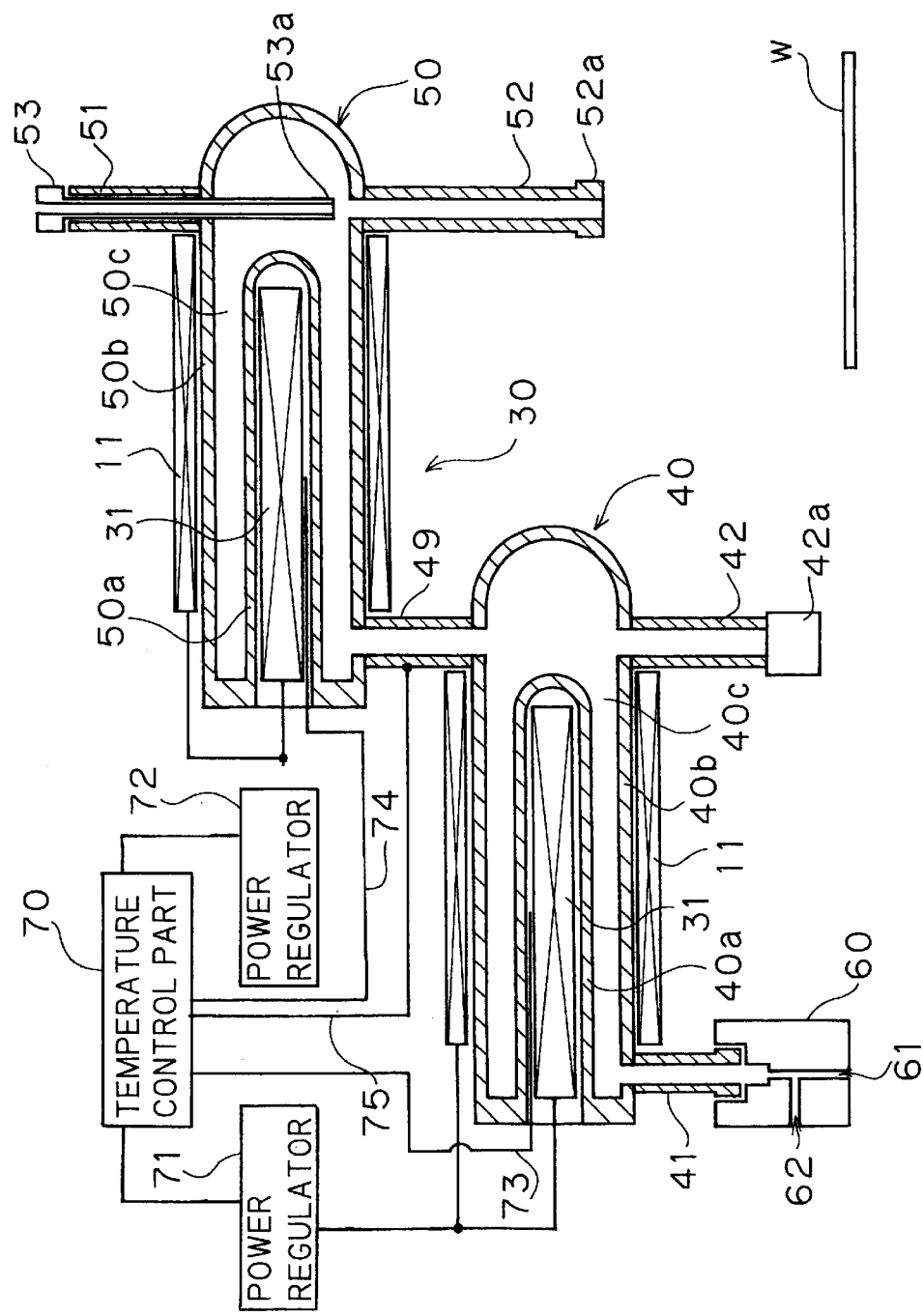
FIG. 2 illustrates the structure of a principal part of the substrate cleaning apparatus shown in FIG. 1.

FIG. 2 illustrates the structure of a principal part of the substrate cleaning apparatus according to this embodiment of the present invention. For convenience of illustration, directions of various ports connected to the steam generation tube 40 and the steam heating tube 50 are different from those in FIG. 1.

A dry steam formation part 30 mainly comprises the steam generation tube 40, the steam heating tube 50, the extratubal heaters 11 and the intratubal heaters 31. The steam generation tube 40 is a duplex tube having an inner tube 40a, an outer tube 40b and a clearance 40c defined therebetween for passing a fluid therethrough. The inner tube 40a is freely engaged in the outer tube 40b, thereby defining the U-shaped clearance 40c. Both of the inner tube 40a and the outer tube 40b are made of quartz.

The pure water inlet port 41 is communicatively connected to the base end of the clearance 40c. The pure water spray 60 is connected to the port end of the pure water inlet port 41, which is a hollow cylindrical pipe. The pure water spray 60 is formed by inserting the forward end of a pure water nozzle 62 into an intermediate portion of a carrier gas passage 61. The pure water nozzle 62 is communicatively connected with the cooling water outlet port 24 of the aluminum water cooling plate 21 and 22, while the carrier gas passage 61 is connected to a carrier gas supply source (not shown). The pure water spray 60 blows atomized pure water into the dry steam formation part 30 through the same principle as that of the so-called atomizer. When a relatively high-speed jet of carrier gas is formed in the carrier gas passage 61, the pure water is extruded from the pure water nozzle 62 and atomized to be blown into the pure water inlet port 41 along with the carrier gas. The carrier gas supplied to the carrier gas passage 61 may be prepared from nitrogen gas, for example.

The internal pressure release port 42 is communicatively connected to an intermediate portion of the clearance 40c. A valve 42a is provided on the port end of the internal pressure release port 42, which is a hollow cylindrical pipe. Gas can be discharged from the steam generation tube 40 for reducing the intratubal pressure by releasing the valve 42a.

The intratubal heater 31 is provided in the inner tube 40a. This intratubal heater 31 heats a fluid passed through the clearance 40c. The extratubal heater 11 of the ceramic fiber furnace 10 is arranged on the outer side of the outer tube 40b. The extratubal heater 11 also heats the fluid passed through the clearance 40c.

The steam heating tube 50 is a duplex tube having an inner tube 50a, an outer tube 50b and a clearance 50c defined therebetween for passing a fluid therethrough. The inner tube 50a is freely engaged in the outer tube 50b thereby defining the U-shaped clearance 50c. Both of the inner tube 50a and the outer tube 50b are made of quartz. In other words, the steam heating tube 50 is a duplex tube similar to the steam generation tube 40.

The communicating tube 49 connects the steam generation tube 40 and the steam heating tube 50 with each other. Both ends of the communicating tube 49, also formed by a hollow cylindrical pipe, are communicatively connected with an intermediate portion of the clearance 40c of the steam generation tube 40 and the base end of the clearance 50c of the steam heating tube 50 respectively. The clearances 40c and 50c of the steam generation tube 40 and the steam heating tube 50 communicate with each other through the communicating tube 49.

The nitrogen gas inlet port 51 is communicatively connected to an intermediate portion of the clearance 50c. A nitrogen gas nozzle 53 is inserted in the nitrogen gas inlet port 51, which is a hollow cylindrical pipe. The nitrogen gas nozzle 53 is connected to a nitrogen gas supply source (not shown) supplying nitrogen gas to the nitrogen gas nozzle 53, which in turn can discharge nitrogen gas serving as carrier gas into the clearance 50c of the steam heating tube 50 from a discharge port 53a provided on its forward end.

The hot water mist injection port 52 is fixedly communicatively connected to the intermediate portion of the clearance 50c. The hot water mist injection port 52, also formed by a hollow tubular cylindrical pipe, is provided along an extension of the insertion direction of the nitrogen gas nozzle 53. In other words, the nitrogen gas discharge direction of the nitrogen gas nozzle 53 and a fluid passage direction in the hot water mist injection port 52 align with each other. An injection opening 52a provided on the forward end of the hot water mist injection port 52 is directed to the surface of a substrate W held by holding means (not shown).

Figure 3:
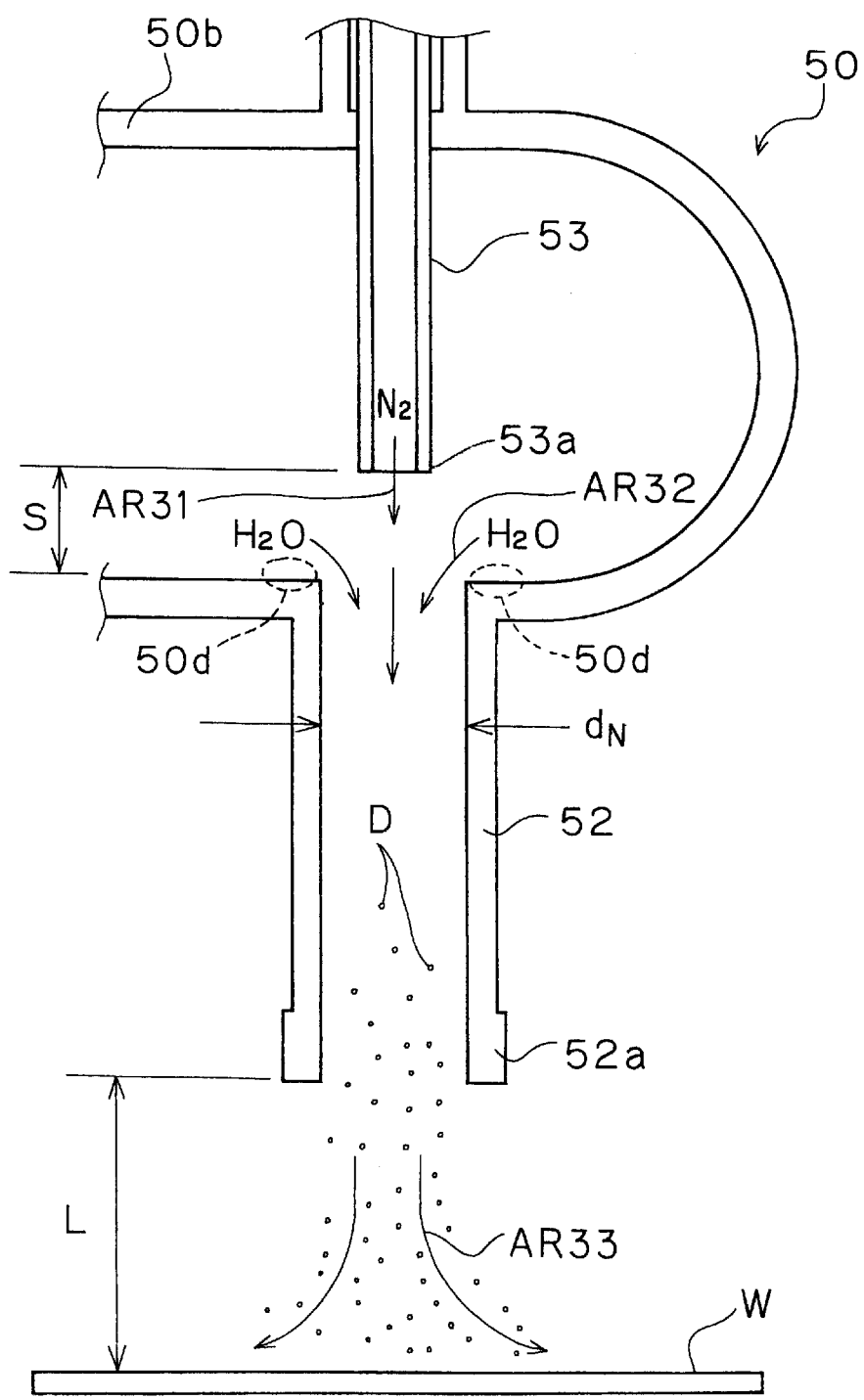
FIG. 3 illustrates formation of hot water mist.

According to this embodiment, as shown in FIG. 3, the distance S between the discharge port 53a (discharge end) provided on the forward end of the nitrogen gas nozzle 53 and the hot water mist injection port 52 is set less than three times the inner diameter $d_N$ of the hot water mist injection port 52 ($S<3\ d_N$). Further, the distance L between the injection opening 52a (discharge end) provided on the forward end of the hot water mist injection port 52 and the main surface of the substrate W is set greater than 20 mm and less than 70 mm (20 mm<L<70 mm).

Referring again to FIG. 2, the inner tube 50a stores the intratubal heater 31 heating the fluid passed through the clearance 50c. The extratubal heater 11 of the ceramic fiber furnace 10 is arranged on the outer side of the outer tube 50b. The extratubal heater 11 also heats the fluid passed through the clearance 50c.

A power regulator 71 supplies power to the intratubal heater 31 and the extratubal heater 11 provided inside and outside the steam generation tube 40 respectively. Another power regulator 72 supplies power to the intratubal heater 31 and the extratubal heater 11 provided inside and outside the steam heating tube 50 respectively. A temperature control part 70 manages the quantities of power supplied from the power regulators 71 and 72. Three thermocouples 73, 74 and 75 are connected to the temperature control part 70. The forward ends of the thermocouples 73, 74 and 75 are in contact with the inner part of the steam generation tube 40, the inner part of the steam heating tube 50 and the communicating tube 49 respectively. The temperature control part 70 measures the temperatures of the steam generation tube 40, the steam heating tube 50 and the communicating tube 49 with the thermocouples 73, 74 and 75 respectively, for feedback-controlling the power regulators 71 and 72 and regulating the quantities of power supplied to the intratubal heaters 31 and the extratubal heaters 11 so that the temperatures reach previously set values respectively.

The process of forming the hot water mist and spraying the same to the substrate W in the substrate cleaning apparatus having the aforementioned structure is now described. First, the pure water spray 60 supplies the pure water for forming the dry steam to the steam generation tube 40 of the dry steam formation part 30 through the pure water inlet port 41. The pure water spray 60 atomizes the pure water and blows the atomized pure water into the dry steam formation part 30 along with the nitrogen gas serving as carrier gas. As hereinabove described, the cooling water outlet ports 24 of the aluminum water cooling plates 21 and 22 and the pure water nozzle 62 of the pure water spray 60 are communicatively connected with each other in this embodiment. Hot pure water flowing through the cooling pipe 25 and absorbing waste heat discharged from the intratubal heater 31 and the extratubal heater 11 of the dry steam formation part 30 to be increased in temperature is supplied to the pure water nozzle 62, so that the pure water spray 60 atomizes the hot pure water and blows the atomized hot pure water into the dry steam formation part 30.

The atomized pure water formed by the pure water spray 60 passes through the pure water inlet port 41 and flows into the clearance 40c of the steam generation tube 40. The atomized pure water flowing into the steam generation tube 40 is heated by the intratubal heater 31 and the extratubal heater 11 from inside and outside the duplex tube and vaporized into steam (water vapor). In this specification, the term "steam (water vapor)" stands for gas-phase water.

As vaporization of the pure water progresses, the clearance 40c of the steam generation tube 40 is filled with the steam of the pure water. However, the steam formed in the steam generation tube 40 may be wet steam. In this specification, the term "wet steam" stands for steam coexisting with liquid-phase water (steam containing liquid-phase water). In other words, the atomized pure water blown from the pure water spray 60 is in a mixed state of a gas phase and a liquid phase where innumerable small droplets float in the nitrogen gas serving as carrier gas. When this atomized pure water is heated in the steam generation tube 40, the small water outlets may partially remain to form wet steam.

The present invention requires a step of converting wet steam formed in the steam generation tube 40 to dry steam since it is necessary to form dry steam. In this specification, the term "dry steam" stands for steam of only a gas phase formed by entirely vaporizing a liquid. The steam heating tube 50 forms such dry steam. In other words, mainly a gas phase part (nitrogen gas+water vapor) of the wet steam formed in the steam generation tube 40 passes through the communicating tube 49 and flows into the clearance 50c of the steam heating tube 50. Small droplets contained in the wet steam formed in the steam generation tube 40, also slightly passing through the communicating tube 49 and flowing into the clearance 50c of the steam heating tube 50, are heated by the intratubal heater 31 and the extratubal heater 11 from inside and outside the duplex tube and completely vaporized. Consequently, the clearance 50c of the steam heating tube 50 is filled with dry steam of only a gas phase formed by completely vaporized pure water.

The temperature control part 70 controls the power regulators 71 and 72 and regulates the quantities of power supplied to the intratubal heaters 31 and the extratubal heaters 11 thereby managing the steam generation tube 40 and the steam heating tube 50 to reach previously set temperatures.

Thus, the dry steam formation part 30 heats the pure water supplied from the pure water spray 60, thereby forming dry steam. The obtained dry steam is guided and fed into the clearance 50c of the steam heating tube 50. According to this embodiment, the pure water spray 60 blows the pure water into the dry steam formation part 30 in an atomized state, whereby the pure water is more readily vaporized as compared with a liquid flow fed as such, and dry steam can be efficiently obtained. The pure water spray 60 atomizes the hot pure water increased in temperature by absorbing waste heat through the aluminum water cooling plates 21 and 22 and blows the atomized pure water into the dry steam formation part 30, whereby the pure water is more readily vaporized and the dry steam can be efficiently obtained.

The dry steam formation part 30 is formed by the two-stage structure of the steam generation tube 40 communicating with the pure water spray 60 for heating the pure water supplied therefrom and generating steam and the steam heating tube 50 communicatively connected with the steam generation tube 40 for heating the steam generated in the steam generation tube 40 and forming dry steam, whereby part of the pure water not completely vaporized in the vapor generation tube 40 is also completely vaporized in the steam heating tube 50, so that dry steam can be reliably obtained.

Further, the steam generation tube 40 and the steam heating tube 50 heat the fluid passed through the clearances 40c and 50c with the intratubal heaters 31 and the extratubal heaters 11 from inside the inner tubes 40a and 50a and outside the outer tubes 40b and 50b respectively, whereby the pure water and the steam thereof can be effectively heated for efficiently obtaining the dry steam.

The nitrogen gas nozzle 53 blows the nitrogen gas, serving as carrier gas, into the clearance 50c of the steam heating tube 50 filled with the dry steam. The nitrogen gas discharge direction of the nitrogen gas nozzle 53 and the fluid passage direction through the hot water mist injection port 52 align with each other, and hence the nitrogen gas discharged from the nitrogen gas nozzle 53 entrains the dry steam formed in the steam heating tube 50 and flows into the hot water mist injection port 52 as such.

FIG. 3 is an enlarged view of the portion around the nitrogen gas nozzle 53 and the hot water mist injection port 52 for illustrating formation of the hot water mist. Referring to FIG. 3, the discharge port 53a of the nitrogen gas nozzle 53 discharges the nitrogen gas serving as carrier gas, as shown by arrow AR31. The discharged nitrogen gas entrains the dry steam formed in the steam heating tube 50 and flows into the hot water mist injection port 52, as shown by arrow AR32. In other words, a gas mixture formed by the nitrogen gas blown from the nitrogen gas nozzle 53 and the dry steam formed in the dry steam formation part 30 flows into the hot water mist injection port 52.

If the distance S between the discharge port 53a provided on the forward end of the nitrogen gas nozzle 53 and the hot water mist injection port 52 is in excess of three times the inner diameter $d_N$ of the hot water mist injection port 52, the nitrogen gas discharged from the discharge port 53a collides with peripheral regions 50d of the inner walls of the steam heating tube 50 close to the hot water mist injection port 52. Consequently, the efficiency for feeding the gas mixture of the nitrogen gas and the dry steam into the hot water mist injection port 52 is reduced. According to this embodiment, therefore, the distance S between the discharge port 53a provided on the forward end of the nitrogen gas nozzle 53 and the hot water mist injection port 52 is set less than three times the inner diameter $d_N$ of the hot water mist injection port 52. Thus, the nitrogen gas discharged from the discharge port 53a entrains the dry steam and efficiently flows into the hot water mist injection port 52 without colliding with the regions 50d shown in FIG. 3. The discharge port 53a may be inserted in the hot water mist injection port 52, so far as the distance S between the discharge port 53a provided on the forward end of the nitrogen gas nozzle 53 and the hot water mist injection port 52 is less than three times the inner diameter $d_N$ of the hot water mist injection port 52.

When the gas mixture of the nitrogen gas and the dry steam flows into the hot water mist injection port 52 formed by a cylindrical pipe, the water vapor is condensed in the hot water mist injection port 52 to form small droplets D. The nitrogen gas receives latent heat of condensation generated in the process of condensation of the water vapor. In other words, the nitrogen gas serving as carrier gas is mixed with the dry steam and functions as a medium absorbing latent heat of condensation, thereby smoothly progressing condensation of water vapor. If only dry steam is blown into the hot water mist injection port 52 without nitrogen gas, water vapor is not quickly condensed but flows out from the hot water mist injection port 52 as such due to absence of a medium absorbing latent heat of condensation.

The temperature of the small droplets D formed by condensation of water vapor is at least higher than the room temperature, leading to formation of such hot water mist that the small droplets D of hot water float in a gas phase consisting of the nitrogen gas and the water vapor in the hot water mist injection port 52. In this specification, the term "hot water mist" stands for such a mixed phase that small droplets of hot water float in a gas phase.

In parallel with the process of forming the small droplets D by condensing the water vapor, the nitrogen gas absorbing the currently generated latent heat of condensation dilates in the hot water mist injection port 52. The nitrogen gas of the hot water mist flowing in the hot water mist injection port 52 formed by a tubular cylindrical pipe dilates, the flow velocity of the hot water mist is accelerated in response to the degree of dilation. The injection opening 52a of the hot water mist injection port 52 injects the hot water mist increased in speed due to such acceleration by dilation of the nitrogen gas in addition to the speed of the nitrogen gas blown from the nitrogen gas nozzle 53, and sprays the same toward the substrate W as shown by arrow AR33.

According to this embodiment, as hereinabove described, not only the dry steam but the gas mixture of the dry steam and the nitrogen gas serving as carrier gas is blown into the hot water mist injection port 52 so that the nitrogen gas functions as a medium absorbing latent heat of condensation, thereby smoothly progressing condensation of the water vapor and efficiently forming the hot water mist. The water vapor is condensed in the hot water mist injection port 52 formed by a cylindrical pipe for supplying latent heat of condensation to the nitrogen gas and dilating the same, thereby accelerating the speed of the flow of the hot water mist and spraying the hot water mist at a high speed from the hot water mist injection port 52 to the substrate W.

The small droplets D contained in the high-speed hot water mist have high kinetic energy and high thermal energy, to exhibit a high colliding effect and a high activation effect on small contaminants adhering to the substrate W. In other words, the substrate cleaning apparatus according to this embodiment can spray high-speed hot water mist attaining a high cleaning effect to the substrate W, for effectively removing contaminants adhering to the substrate W as a result.

According to this embodiment, the dry steam is reliably formed in a simple miniature structure due to the two-stage heating system of the steam generation tube 40 and the steam heating tube 50. Therefore, the dry steam formation part 30 can be built into the substrate cleaning apparatus, and no dedicated steam formation device may be provided outside the apparatus. Therefore, no supply pipe may be heated dissimilarly to the prior art, whereby the cost can be reduced.

When the dry steam formation part 30 is built into the substrate cleaning apparatus, the length of a supply path is so reduced that dry steam having high purity can be formed as a result. According to this embodiment, dry steam having high purity can be formed through a simple miniature structure by building the dry steam formation part 30 consisting of the two-stage structure of the steam generation tube 40 and the steam heating tube 50 into the substrate cleaning apparatus, whereby hot water mist attaining a high cleaning effect with a small quantity of impurities can be sprayed to the substrate W as a result.

The distance L between the injection opening 52a provided on the forward end of the hot water mist injection port 52 and the main surface of the substrate W is set greater than 5 mm and less than 70 mm for the following reason: If the distance L is not more than 5 mm, the small droplets D contained in the high-speed hot water mist are splashed back on the surface of the substrate W due to excessive kinetic energy to reduce the removal rate for the contaminants. If the distance L exceeds 70 mm, on the other hand, the degree of deceleration of the hot water mist is so large that the kinetic energy of the small droplets D is remarkably reduced to reduce the removal rate for the contaminants. In order to obtain an excellent removal rate for the contaminants, therefore, the distance L between the injection opening 52a provided on the forward end of the hot water mist injection port 52 and the main surface of the substrate W is preferably set greater than 5 mm and less than 70 mm. Specifically, the distance L between the injection opening 52a provided on the forward end of the hot water mist injection port 52 and the main surface of the substrate W is set 10 mm.

When no hot water mist may be injected in the aforementioned substrate cleaning apparatus, the valve 42a connected to the internal pressure release port 42 is released thereby leaking the steam formed in the steam generation tube 40 from the apparatus. At this time, the steam formed in the steam generation tube 40 cleans the clearance 40c of the steam generation tube 40 and keeps the same clean. When injecting high-speed hot water mist from the hot water mist injection port 52, the valve 42a is closed for supplying the steam formed in the steam generation tube 40 to the steam heating tube 50, as a matter of course.

While the embodiment of the present invention has been described, the present invention is not restricted to the aforementioned embodiment. For example, while the pure water spray 60 atomizes the pure water and blows the same into the dry steam formation part 30 in the aforementioned embodiment, the pure water may not necessarily be blown in an atomized state but may alternatively be fed into the steam generation tube 40 as a fluid. When the pure water is blown into the steam generation tube 40 in an atomized state, however, vaporization more quickly progresses so that the steam can be efficiently formed.

The dry steam formation part 30 is not restricted to the two-stage structure of the steam generation tube 40 and the steam heating tube 50 but may alternatively have a single-stage structure so far as the blown pure water can be completely vaporized for obtaining dry steam.

The carrier gas blown from the nitrogen gas nozzle 53 is not restricted to the nitrogen gas but may alternatively be prepared from another gas such as air, for example. However, the carrier gas sprayed to the substrate W must be clean gas containing no particles or the like.

Summarizing the above contents, the substrate cleaning apparatus according to the present invention can be modified in various ways in a mode mixing dry steam obtained by heating pure water with carrier gas and blowing the mixture into a tubular member. The carrier gas functions as a medium absorbing latent heat of condensation for smoothly progressing condensation of water vapor and efficiently forming hot water mist. The formed hot water mist is accelerated due to dilation of the carrier gas increased in temperature by absorbing latent heat of condensation, and sprayed to the substrate W as high-speed hot water mist.

Therefore, the dry steam may not necessarily be formed in the substrate cleaning apparatus but means forming dry steam may alternatively be provided outside the apparatus in a factory etc. where the apparatus is set so that the apparatus is provided with a pipe guiding and feeding dry steam fed from the means forming dry steam and a discharge nozzle fixedly provided on the pipe for guiding a gas mixture obtained by mixing the dry steam with nitrogen gas to the discharge nozzle. When the dry steam formation part 30 is provided in the substrate cleaning apparatus as in the aforementioned embodiment, however, the dry steam can be readily prevented from dew formation while dry steam of high purity can be guided to the hot water mist injection port 52.

The nitrogen gas serving as carrier gas may not necessarily be blown from the nitrogen gas nozzle 53. For example, nitrogen gas may alternatively be introduced in the stage of forming dry steam for guiding the obtained gas mixture of the dry steam and the nitrogen gas to the hot water mist injection port 52. When the nitrogen gas nozzle 53 aligning with the fluid passage direction through the hot water mist injection port 52 feeds nitrogen gas as in the aforementioned embodiment, however, the flow of the hot water mist can be more effectively accelerated.

While the invention has been shown and described in detail, the foregoing description is in all aspects illustrative and not restrictive. It is therefore understood that numerous modifications and variations can be devised without departing from the scope of the invention.

What is claimed is:

1. A substrate cleaning apparatus for cleaning a substrate by spraying hot water mist thereto, comprising:
   a steam pipe guiding and feeding steam obtained by heating pure water;
   a gas inlet port for feeding carrier gas into said steam pipe; and
   a tubular discharge nozzle fixedly provided on said steam pipe for forming hot water mist by guiding a gas mixture prepared by mixing steam guided by said steam pipe and carrier gas fed from said gas inlet port with each other while condensing said steam by having latent heat of condensation absorbed by said carrier gas and spraying said hot water mist onto said substrate.

2. The substrate cleaning apparatus according to claim 1, further comprising a gas discharge pipe discharging said carrier gas in said gas inlet port, wherein
   a gas discharge direction of said gas discharge pipe aligns with a fluid passage direction of said discharge nozzle.

3. The substrate cleaning apparatus according to claim 2, wherein
   the distance between a discharge end of said gas discharge pipe and said discharge nozzle is less than three times the inner diameter of said discharge nozzle.

4. The substrate cleaning apparatus according to claim 3, wherein
   the distance between a discharge end of said discharge nozzle and said substrate is greater than 5 mm and less than 70 mm.

5. The substrate cleaning apparatus according to claim 1, further comprising:
   a dry steam formation part for heating pure water and forming dry steam, and
   a pure water supply part for supplying said pure water for forming said dry steam to said dry steam formation part, wherein
      said steam pipe is provided in said dry steam formation part.

6. The substrate cleaning apparatus according to claim 5, wherein
   said dry steam formation part includes:
      a steam generation part communicating with said pure water supply part for heating said pure water supplied from said pure water supply part and generating steam, and a steam heating part communicatively connected with said steam generation part for heating said steam generated in said steam generation part and forming said dry steam.

7. A substrate cleaning apparatus for cleaning a substrate by spraying hot water mist thereto, comprising
- a pure water supply part for supplying pure water for forming dry steam;
- a steam generation part communicating with said pure water supply part for heating said pure water supplied from said pure water supply part and generating steam;
- a steam heating part communicatively connected with said steam generation part for heating said steam generated in said steam generation part and forming dry steam;
- a gas inlet port for feeding carrier gas into said steam heating part; and
- a discharge nozzle fixedly provided on said steam heating part for forming hot water mist by guiding a gas mixture prepared by mixing said dry steam formed at said steam heating part and said carrier gas fed from said gas inlet port with each other while condensing said dry steam by having latent heat of condensation absorbed by said carrier gas and spraying said hot water mist onto said substrate.

8. The substrate cleaning apparatus according to claim 7, wherein
each of said steam generation part and said steam heating part comprises:
- a duplex tube having an inner tube, an outer tube and a clearance defined between said inner tube and said outer tube for passing a fluid therethrough,
- an inner heating part provided inside said inner tube for heating said fluid passed through said clearance, and
- an outer heating part provided outside said outer tube for heating said fluid passed through said clearance.

9. The substrate cleaning apparatus according to claim 8, further comprising a cooling part storing a cooling pipe for feeding pure water into said cooling pipe thereby absorbing waste heat discharged from said steam generation part and said steam heating part, wherein
said pure water supply part supplies said pure water flowing through said cooling pipe of said cooling part to said steam generation part.

10. The substrate cleaning apparatus according to claim 9, wherein
said pure water supply part blows atomized said pure water into said steam generation part.

11. A method for cleaning a product with a spray of a hot water mist, the method comprising:
- guiding and feeding steam obtained by heating pure water and passing it through a steampipe;
- feeding a carrier gas into said steampipe via a gas inlet port;
- feeding the steam and the carrier gas through a tubular discharge nozzle in a manner which forms a hot water mist in the tubular nozzle, by guiding a gas mixture comprising the steam and the carrier gas to condense the steam by having latent heat of condensation absorbed by said carrier gas; and
- spraying said hot water mist onto the product.

* * * * *